US008169217B2

(12) United States Patent
Duerk et al.

(10) Patent No.: US 8,169,217 B2
(45) Date of Patent: May 1, 2012

(54) MITIGATING SATURATION ARTIFACTS ASSOCIATED WITH INTERSECTING PLANE TRUEFISP ACQUISITIONS THROUGH GROUPED REVERSE CENTRIC PHASE ENCODING

(76) Inventors: Jeffrey L. Duerk, Avon Lake, OH (US); Jeffrey L. Sunshine, Pepper Pike, OH (US); Mark A. Griswold, Shaker Heights, OH (US); Jamal J. Derakhshan, Cleveland Heights, OH (US)

( * ) Notice: Subject to any disclaimer, the term of this patent is extended or adjusted under 35 U.S.C. 154(b) by 373 days.

(21) Appl. No.: 12/423,952

(22) Filed: Apr. 15, 2009

(65) Prior Publication Data
US 2009/0261827 A1    Oct. 22, 2009

Related U.S. Application Data

(60) Provisional application No. 61/124,741, filed on Apr. 18, 2008.

(51) Int. Cl.
*G01V 3/00* (2006.01)
(52) U.S. Cl. .................. 324/307; 324/309; 324/318
(58) Field of Classification Search .......... 324/300–322; 600/407–435; 382/128–131
See application file for complete search history.

(56) References Cited

U.S. PATENT DOCUMENTS

| | | | | |
|---|---|---|---|---|
| 6,320,378 B1 * | 11/2001 | Maier et al. | ..................... | 324/307 |
| 6,628,116 B1 * | 9/2003 | Kraft et al. | ..................... | 324/307 |
| 6,794,870 B2 * | 9/2004 | Hennig | ......................... | 324/309 |
| 7,046,004 B2 * | 5/2006 | Bieri et al. | ..................... | 324/307 |
| 7,245,125 B2 * | 7/2007 | Harer et al. | ..................... | 324/310 |
| 7,330,027 B2 * | 2/2008 | Kozerke et al. | ............... | 324/307 |
| 7,372,266 B2 * | 5/2008 | Markl et al. | .................. | 324/307 |
| 7,514,923 B2 * | 4/2009 | Zhao | ............................. | 324/309 |
| 7,514,927 B2 * | 4/2009 | Herzka et al. | ................. | 324/318 |
| 7,596,402 B2 * | 9/2009 | Duerk et al. | ................... | 600/423 |
| 7,623,903 B2 * | 11/2009 | Wacker et al. | ................ | 600/424 |
| 7,646,198 B2 * | 1/2010 | Bookwalter et al. | .......... | 324/307 |
| 7,728,588 B2 * | 6/2010 | Feiweier | ....................... | 324/309 |
| 7,864,999 B2 * | 1/2011 | Chang et al. | .................. | 382/128 |
| 2004/0039278 A1 * | 2/2004 | Wacker et al. | ................ | 600/410 |
| 2005/0054914 A1 * | 3/2005 | Duerk et al. | .................. | 600/423 |
| 2005/0258829 A1 * | 11/2005 | Bieri et al. | ..................... | 324/307 |
| 2006/0125476 A1 * | 6/2006 | Markl et al. | .................. | 324/307 |
| 2006/0161060 A1 * | 7/2006 | Pai | ................. | 600/431 |
| 2006/0208730 A1 * | 9/2006 | Kozerke et al. | ............... | 324/307 |
| 2007/0110290 A1 * | 5/2007 | Chang et al. | .................. | 382/128 |
| 2008/0218169 A1 * | 9/2008 | Bookwalter et al. | .......... | 324/309 |
| 2009/0177075 A1 * | 7/2009 | Derakhshan et al. | ......... | 600/410 |
| 2009/0261827 A1 * | 10/2009 | Duerk et al. | .................. | 324/309 |
| 2009/0322331 A1 * | 12/2009 | Buracas | ....................... | 324/309 |
| 2010/0066365 A1 * | 3/2010 | Bookwalter et al. | .......... | 324/309 |
| 2010/0106007 A1 * | 4/2010 | Wacker et al. | ................ | 600/420 |
| 2011/0025327 A1 * | 2/2011 | Deoni et al. | .................. | 324/309 |

* cited by examiner

*Primary Examiner* — Brij B Shrivastav
*Assistant Examiner* — Tiffany Fetzner
(74) *Attorney, Agent, or Firm* — J T Kalnay

(57) ABSTRACT

Systems methods, and other embodiments associated with acquiring intersecting TrueFISP images using grouped reverse centric phase encoding are described. One example method includes controlling an MRI apparatus to produce a TrueFISP sequence that delays acquisition of the center of k-space to reduce saturation banding artifacts. The example method also includes controlling the MRI apparatus to produce a TrueFISP sequence that reduces eddy current artifacts by grouping (e.g., pairing) lines in k-space. The method concludes by acquiring NMR signal in response to the TrueFISP sequence.

20 Claims, 10 Drawing Sheets

210  Linear

220
 Reverse Centric
230

Paired Reverse Centric

Linear

Paired Reverse Centric

MITIGATING SATURATION ARTIFACTS ASSOCIATED WITH INTERSECTING PLANE TRUEFISP ACQUISITIONS THROUGH GROUPED REVERSE CENTRIC PHASE ENCODING

PRIORITY CLAIM

This application claims the benefit of U.S. Provisional Application 61/124,741 filed Apr. 18, 2008, titled TrueFISP Acquisitions In Multiple Intersecting Planes With Paired Reverse Centric Phase Encoding, by the same inventors.

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Combinations of intersecting transverse, coronal, and saggital acquisition planes may be used in TrueFISP (True Fast Imaging with Steady State Precession) magnetic resonance imaging (MRI). For example, intersecting acquisition planes facilitate anatomical localization, facilitate MRI guided interventions, facilitate imaging freely moving subjects, and so on. However, saturation artifacts have conventionally been associated with intersecting acquisition planes. These saturation artifacts may include saturation banding that is distinct from the well known TrueFISP off-resonance banding artifacts. Thus, previous attempts at mitigating off-resonance banding artifacts may be irrelevant to mitigating saturation artifacts associated with intersecting acquisition planes. Intersection saturation banding may involve areas of low signal or signal attenuation at intersections of orthogonal imaging planes. Artifacts are associated with signal intensities that are unrelated to the spatial distribution of the object being imaged.

Interventional MRI (IMRI) may employ TrueFISP acquisitions for multiplanar guidance. The multiplanar guidance may be affected by the intersection saturation artifacts that occur at the intersections of the multiple planes. FIG. 7 illustrates a conventional TrueFISP pulse sequence. In coherent steady-state sequences, transverse magnetization may be left over after the data acquisition period. Therefore, coherent steady-state sequences may include rewinding the transverse magnetization by reversing the sign of the gradient pulses. In FISP (fast imaging with steady precession), only the phase-encode gradient is rewound. In TrueFISP, which may also be referred to as balanced Fast Field Echo (bFFE)), the sequence has balanced, rewinding gradients in all three directions.

Barker and Williams described interleaving acquisitions in Improving Resolution in MRI by Interleaving Data Acquisition for Increased Digitization Rates, Volume 25, No. 2, Magnetic Resonance in Medicine, pg 334-336 (1992). Interleaving involves arranging things in or as if they were in alternate layers. Interleaving can be used to improve acquisition time. U.S. Pat. No. 6,795,723 describes interleaved phase encoding acquisition. Butts, et al. also discuss interleaving in Interleaved Echo Planar Imaging on a Standard MRI System, Volume 31, No. 2, Magnetic Resonance in Medicine, pg 67-72, (1994). While interleaving may have been associated with improved acquisition time, it has not been associated with mitigating saturation artifacts that occur at the intersections of multiple planes.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
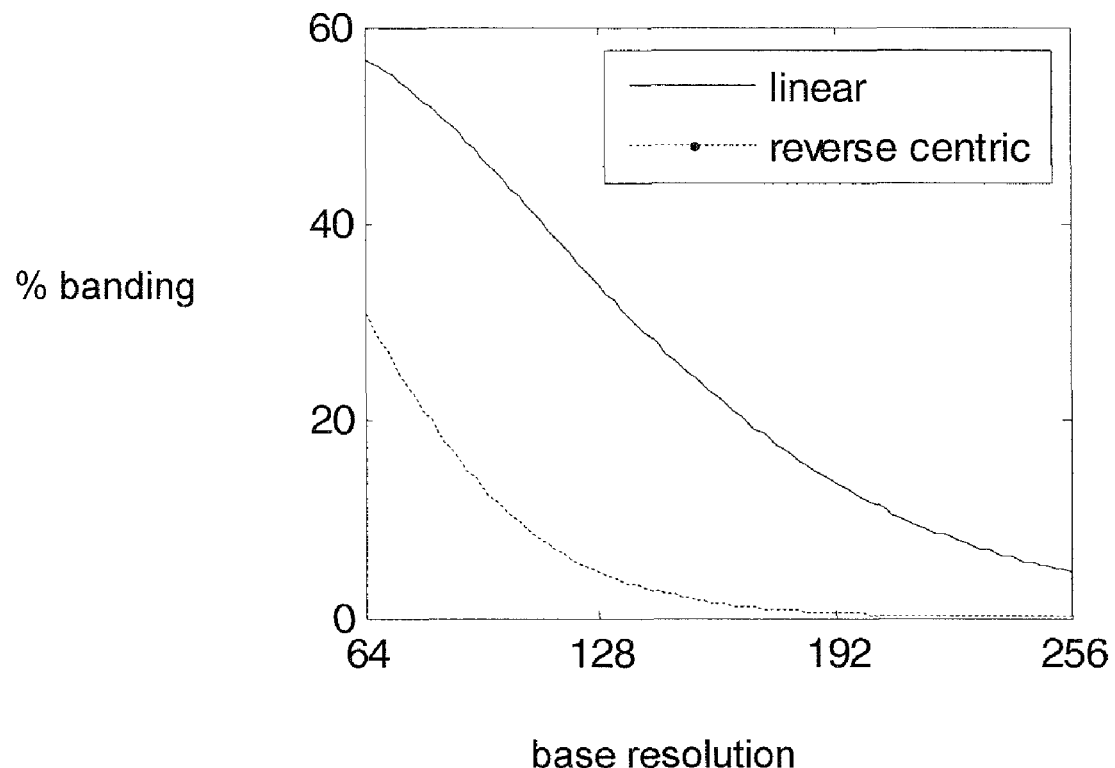
FIG. 1 plots orthogonal plane saturation associated with intersecting plane banding artifacts for different phase encoding schemes and different phase encoding resolutions.
Figure 2:
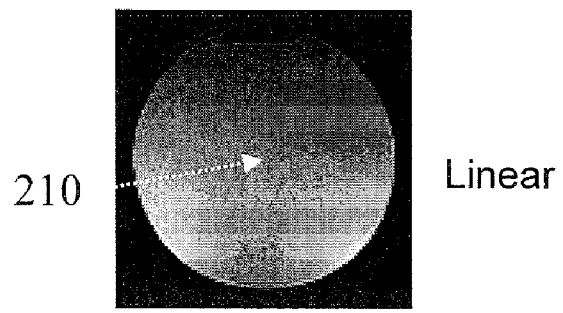
FIG. 2 illustrates phantom imaging results that compare linear phase encoding to reverse centric phase encoding to paired reverse centric phase encoding in TrueFISP acquisitions.
Figure 2:
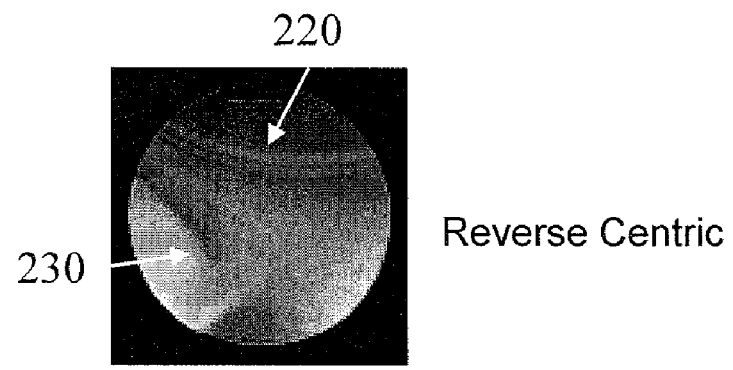
Figure 2:
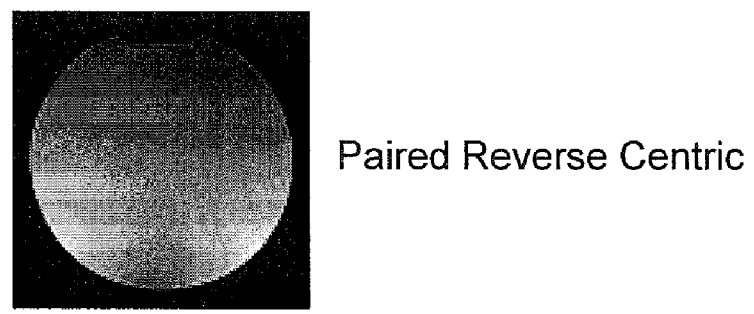
Figure 3:
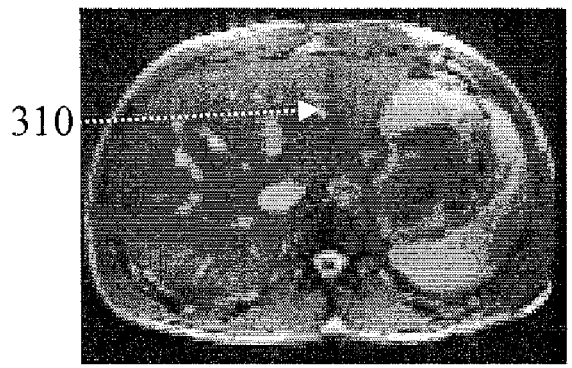
FIG. 3 illustrates axial human abdominal images acquired using intersecting plane acquisitions with linear and with paired reverse centric phase encoding.
Figure 3:
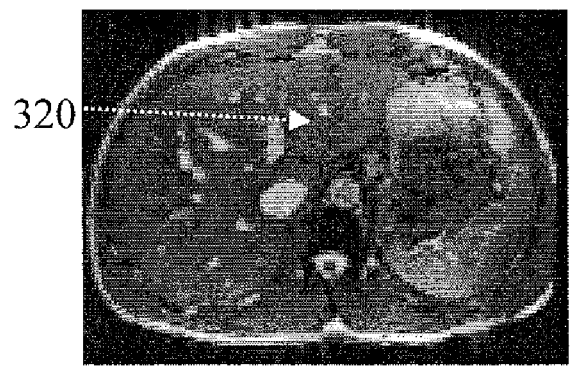

Example systems and methods reduce saturation banding artifacts at intersections of intersecting planes in multi-plane TrueFISP acquisitions. FIGS. 1, 2, and 3 demonstrate how intersection saturation banding artifacts have been mitigated. In one example, reverse centric phase encoding is used to delay the acquisition of the center of k-space. Phase encoding may be performed according to different techniques. These techniques include, for example, linear phase encoding, centric phase encoding, reverse centric phase encoding, random phase encoding, and so on. Recall that phase encoding order is concerned with the temporal order in which phase encoding gradient pulses are applied. Recall also that phase encoding concerns encoding the distribution of sources of nuclear magnetic resonance (NMR) signals along a direction in space. Different phases may be produced by applying a pulsed magnetic field gradient along the direction in space prior to detecting a signal. Acquiring a set of NMR signals with a viable set of different phase encoding gradients facilitates reconstructing the distribution of sources in the phase encoded direction.

The center of k-space stores signal and contrast information while the outer-regions of k-space store resolution information (e.g., boundary information, edge information). Recall that k-space is a raw data space that stores digitized NMR signals during data acquisition. In some conventional MRI approaches, raw data is acquired along a uniformly sampled rectilinear k-space trajectory. An image is then reconstructed by direct Fourier transformation. In linear phase encoding, phase encoding progresses from maximum negative values to maximum positive values, or vice versa.

Schemes other than uniform sampling along a rectilinear k-space trajectory are also used in MRI. For example, radial and spiral imaging may be employed. In radial and spiral imaging, the k-space trajectories are not uniform. Since the data is not uniform, it may need to be re-gridded onto a uniform rectilinear grid before Fourier transform based reconstruction is performed. The non-rectilinear approaches facilitate controlling whether the center of k-space is to be sampled first or last. In centric phase encoding, the smallest magnitude $K_{PE}$ is measured first and then alternates outward. An example centric phase encoding scheme is a spiral (also known as spiral-out) acquisition. In reverse centric phase encoding, the largest magnitude $K_{PE}$ is measured first, and then alternates inward. An example reverse-centric phase encoding scheme is a reverse spiral (or spiral-in) acquisition.

Example systems and methods also reduce TrueFISP artifacts associated with eddy currents. FIG. 2 illustrates mitigation of eddy current artifacts. In one example, adjacent k-space lines are paired to reduce the eddy current artifacts. While adjacent k-space lines are described as being paired, the example systems and methods are not so limited. In one example, pairs of lines may not be adjacent. In another example, more than two related lines may be acquired. Thus, example systems and methods perform intersecting TrueFISP acquisitions with two modifications over conventional systems. The modifications include using reverse centric phase encoding and grouping the reverse centric phase encoding lines.

FIG. 1 plots orthogonal plane saturation associated with intersecting plane saturation banding artifacts for reverse centric phase encoding and for linear phase encoding. The data illustrated was acquired for simulated liver tissue with the following parameters (FA=80 degrees, T1=590 ms, T2=56 ms). Note the marked reduction in banding associated with reverse centric phase encoding as compared to linear phase encoding. The plot illustrates how example systems and methods may facilitate reducing banding across a range of base resolutions. In different examples, banding may be reduced across base resolutions including a base resolution of 64, a base resolution of 128, a base resolution of 192, a base resolution of 256, and so on.

Example systems and methods facilitate collecting interleaved intersecting TrueFISP images with reduced saturation banding artifacts by pairing interleave lines and using reverse centric phase encoding. Example systems and methods collect fast, high contrast to noise ratio (CNR) multi-plane images with reduced saturation banding and without introducing artifacts associated with eddy currents. CNR measures a difference between signal to noise ratios (SNR). SNR measures signal intensities related to spatial distribution of tissues (signal) and signal not associated with spatial distribution of tissues being imaged (noise). Noise is theoretically unavoidable and may be caused by electromagnetic noise in the body due to movement of charged particles, by small anomalies in the measurement electronics, and so on.

FIG. 2 illustrates phantom imaging results that compare linear phase encoding to reverse centric phase encoding to paired reverse centric phase encoding. Note that saturation artifacts associated with intersecting planes when using a TrueFISP acquisition have been mitigated through the paired reverse centric phase encoding. In the linear image, note the orthogonal plane saturation banding artifact 210. In the reverse centric image, note the eddy current artifacts 220 and 230. In the paired reverse centric phase encoding image, note that it is artifact free. Thus, neither linear nor even reverse centric phase encoding are artifact free.

Example systems and methods may be employed in conjunction with real-time three plane visualization. Thus, example systems and methods may be associated with interventional MRI (IMRI), dynamic imaging, and so on. In one example, TrueFISP acquisitions with paired reverse centric phase encoding may be used to guide and monitor an inserted device (e.g., catheter), and may also be used for anatomical localization, and so on.

FIG. 3 illustrates axial human abdominal images acquired using intersecting plane acquisitions with linear and with paired reverse centric phase encoding. Note the presence of the intersection plane saturation band artifact 310 in the linear acquisition. Note the mitigation of the intersection plane saturation band artifact 320 in the paired reverse centric acquisition.

Figure 4:
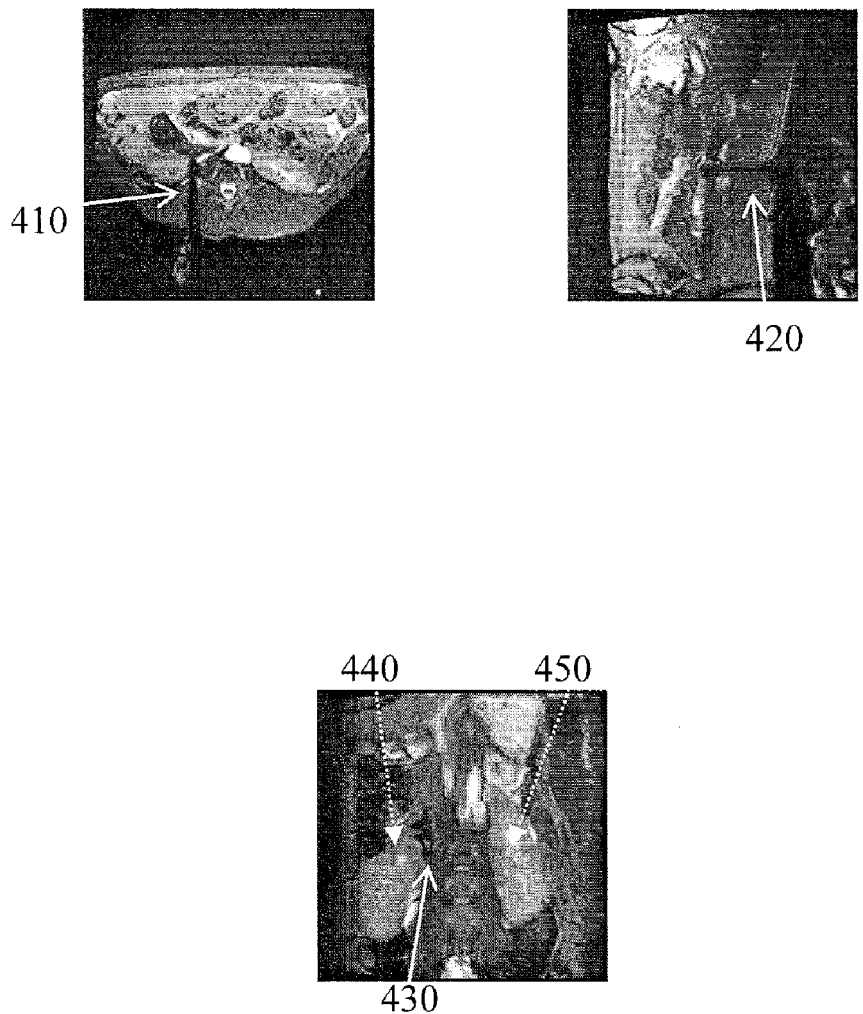
FIG. 4 illustrates three intersecting images acquired using paired reverse centric phase encoding during MR guided RF electrode insertion.

FIG. 4 illustrates three intersecting images acquired using paired reverse centric phase encoding during MR guided RF electrode insertion. The images are high resolution interleaved orthogonal images. The images were acquired while guiding an RF electrode to a porcine adrenal gland. An RF electrode artifact is illustrated at 410, 420, and 430. Small remaining orthogonal plane saturation artifacts are illustrated at 440 and 450.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Figure 5:
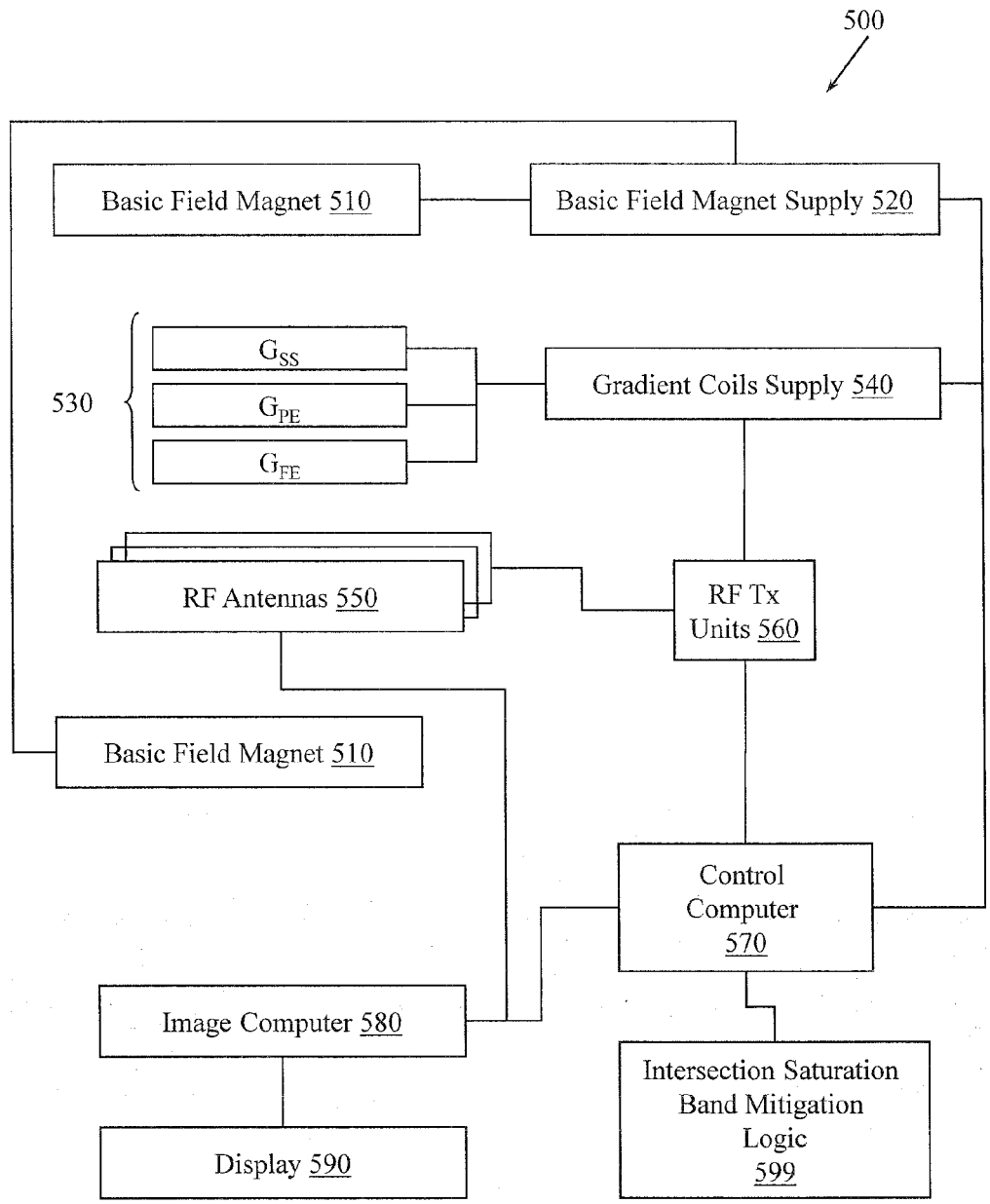
FIG. 5 illustrates an MRI apparatus associated with acquiring intersecting TrueFISP acquisitions using grouped reverse centric encoding.
Figure 7:
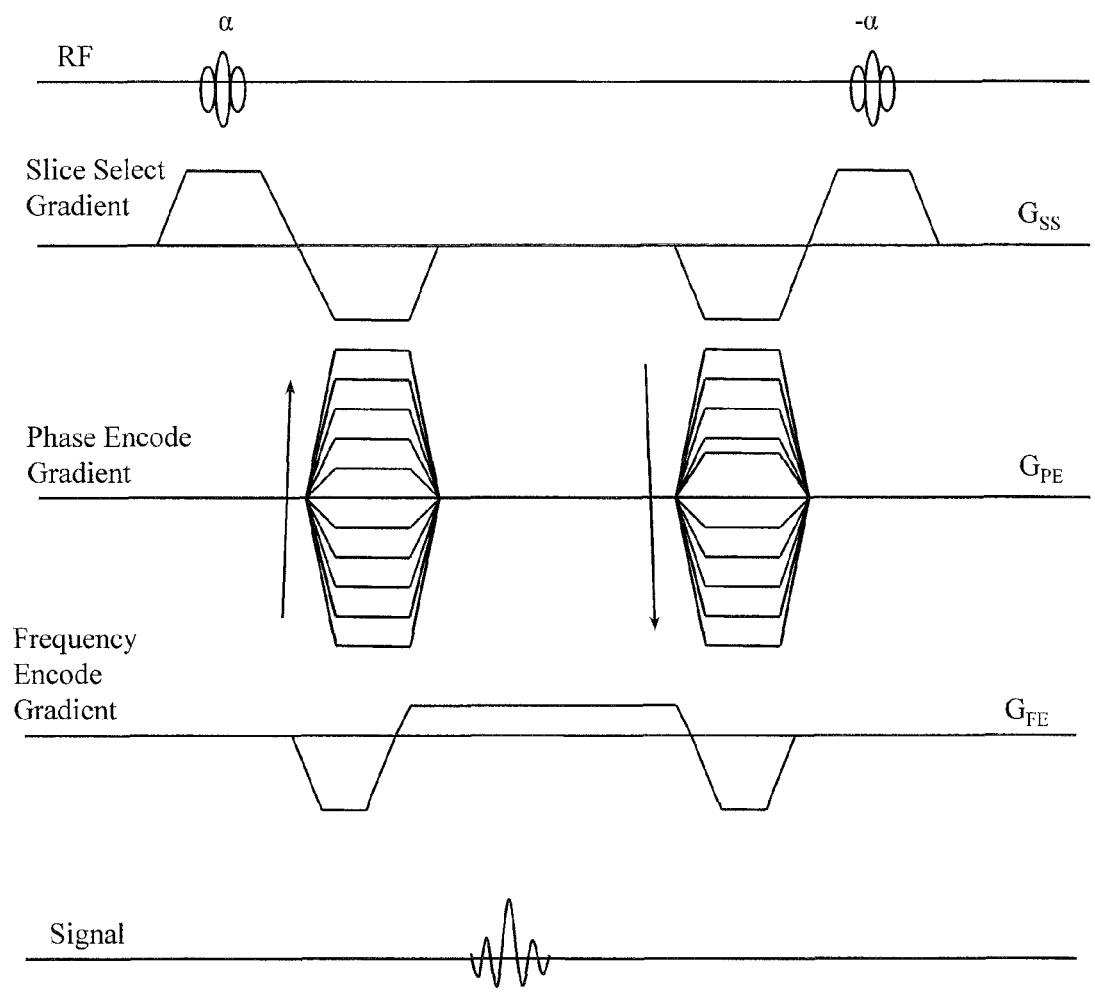
FIG. 7 illustrates a TrueFISP pulse sequence diagram.

FIG. 5 illustrates an example MRI apparatus 500 configured with an intersection saturation band mitigation logic 599 to facilitate acquiring intersecting TrueFISP acquisitions using grouped reverse centric phase encoding. The logic 599 may be configured with elements of example apparatus described herein and/or may perform example methods described herein. Therefore, intersection saturation band mitigation logic 599 may provide means (e.g., hardware, software, firmware) for producing a TrueFISP MRI sequence. The TrueFISP MRI sequence may be similar to that illustrated in FIG. 7. Logic 599 may also provide means (e.g., hardware, software, firmware) for applying the TrueFISP sequence to an object to be imaged using reverse centric phase encoding. In one example, the reverse centric phase encoding may be applied according to a reverse spiral pattern. Logic 599 may also provide means (e.g., hardware, software, firmware) for controlling the MRI apparatus to acquire NMR signal in response to the TrueFISP sequence. The NMR signal is to be acquired from at least two slices that intersect inside the object to be imaged. The NMR signal is to be acquired from grouped (e.g., paired) related (e.g., adjacent) lines in k-space according to an interleaved pattern.

The apparatus 500 includes a basic field magnet(s) 510 and a basic field magnet supply 520. Ideally, the basic field magnets 510 would produce a uniform $B_0$ field. However, in practice, the $B_0$ field may not be uniform, and may vary over an object being imaged by the MRI apparatus 500. MRI apparatus 500 may include gradient coils 530 configured to emit gradient magnetic fields like $G_{SS}$, $G_{PE}$ and $G_{FE}$, denoting the slice select, phase encoding and frequency encoding directions. The gradient coils 530 may be controlled, at least in part, by a gradient coils supply 540. In some examples, the timing, strength, and orientation of the gradient magnetic fields may be controlled, and thus selectively adapted during an MRI procedure.

MRI apparatus 500 may include a set of RF antennas 550 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 550 may be controlled, at least in part, by a set of RF transmission units 560. An RF transmission unit 560 may provide a signal to an RF antenna 550.

The gradient coils supply 540 and the RF transmission units 560 may be controlled, at least in part, by a control computer 570. In one example, the control computer 570 may be programmed to control an IMRI device as described herein. The magnetic resonance signals received from the RF antennas 550 can be employed to generate an image and thus may be subject to a transformation process like a two dimensional FFT that generates pixilated image data. The transformation can be performed by an image computer 580 or other similar processing device. The image data may then be shown on a display 590. While FIG. 5 illustrates an example MRI apparatus 500 that includes various components connected in various ways, it is to be appreciated that other MRI apparatus may include other components connected in other ways.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 6:
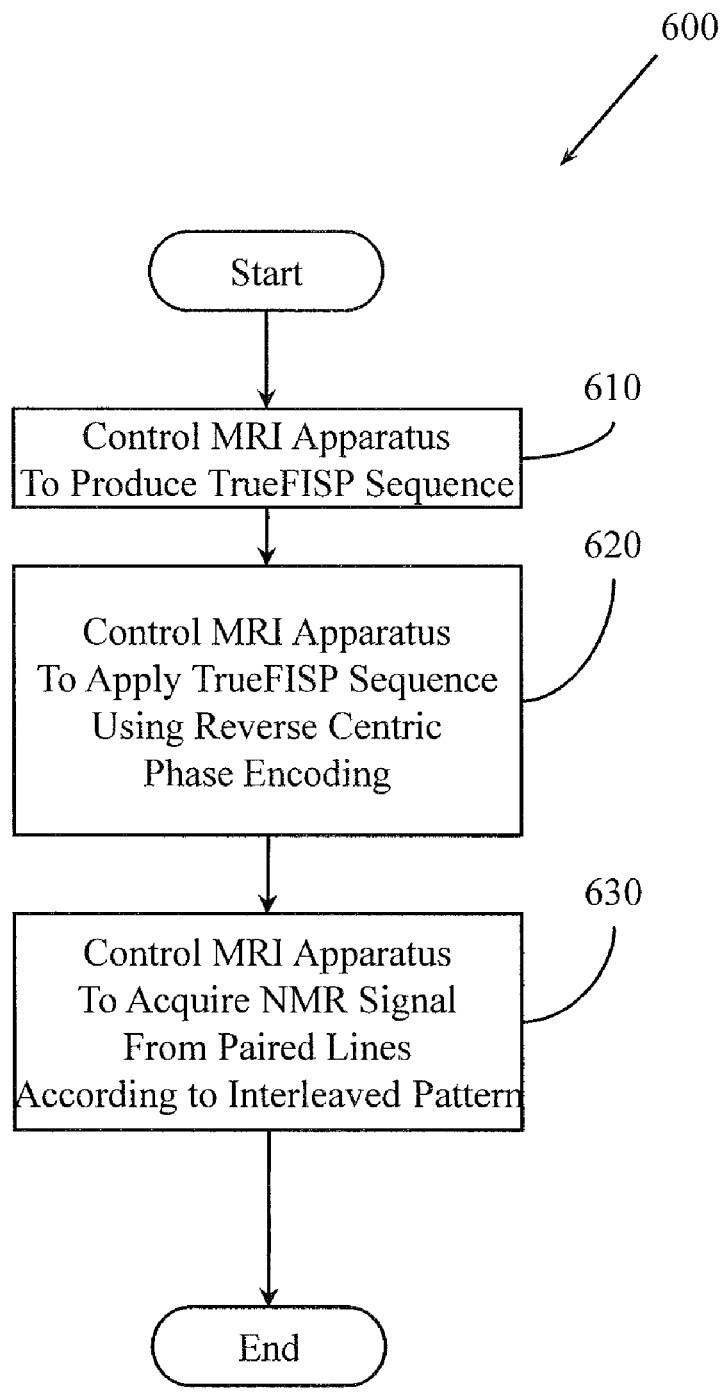
FIG. 6 illustrates a method associated with acquiring intersecting TrueFISP acquisitions using grouped reverse centric phase encoding.

FIG. 6 illustrates a method 600 associated with intersecting TrueFISP acquisitions with paired reverse centric phase encoding. Method 600 may include, at 610, controlling an MRI apparatus to produce a TrueFISP sequence. The TrueFISP sequence will be used to excite signal in at least two intersecting planes according to a reverse centric phase encoding. In one example, the intersecting planes may be orthogonal. NMR signal will then be acquired from grouped (e.g., paired) lines in k-space. Therefore, the controlling at 610 may include configuring one or more of, a pattern associated with reverse centric phase encoding, which lines in k-space are to be grouped, and an interleave pattern to be used for acquiring NMR signal from the at least two slices. The configuration is designed to produce a combination of acquisition conditions that mitigate intersection saturation bands and that mitigate eddy current artifacts to the point where NMR signal associated with intersections between the at least two slices that intersect satisfies a desired contrast to noise ratio.

Method 600 may also include, at 620, controlling the MRI apparatus to apply the TrueFISP sequence to an object to be imaged using reverse centric phase encoding. The reverse centric phase encoding may be associated with, for example, a reverse spiral pattern. While a reverse spiral pattern is described, one skilled in the art will appreciate that other patterns may be employed.

Method 600 may also include, at 630, controlling the MRI apparatus to acquire NMR signal from at least two slices that intersect inside the field of view (FOV) of the object. The NMR signal will be produced in response to the TrueFISP sequence being applied to the object to be imaged. The MRI apparatus is controlled to acquire the NMR signal from grouped (e.g., paired) related (e.g., adjacent) lines in k-space according to an interleaved pattern.

In one example, method 600 facilitates generating an anatomical localizer. In another example, method 600 facilitates a guided intervention. The MRI apparatus may be, for example, an interventional MRI apparatus. The TrueFISP sequence may provide for both multiplanar guidance and real-time three plane visualization. Therefore, in one embodiment, method 600 may include providing a real-time multi-plane visualization of a portion of the FOV. The multi-plane visualization may be, for example, a two plane visualization or a three plane visualization. Since an anatomical localizer may be provided and since interventions may be guided, in one example, method 600 may include controlling navigation of a device in the object to be imaged based, at least in part, on the real-time multi-plane visualization. This navigation control may occur in two or more planes.

While FIG. 6 illustrates various actions occurring in serial, it is to be appreciated that various actions illustrated in FIG. 6 could occur substantially in parallel. By way of illustration, a first process could produce the TrueFISP pulse sequence, a second process could apply the TrueFISP sequence according to a reverse centric phase encoding scheme and a third process could acquire NMR signal from paired lines in k-space according to an interleaved plan. While three processes are described, it is to be appreciated that a greater and/or lesser number of processes could be employed and that lightweight processes, regular processes, threads, and other approaches could be employed.

Figure 8:
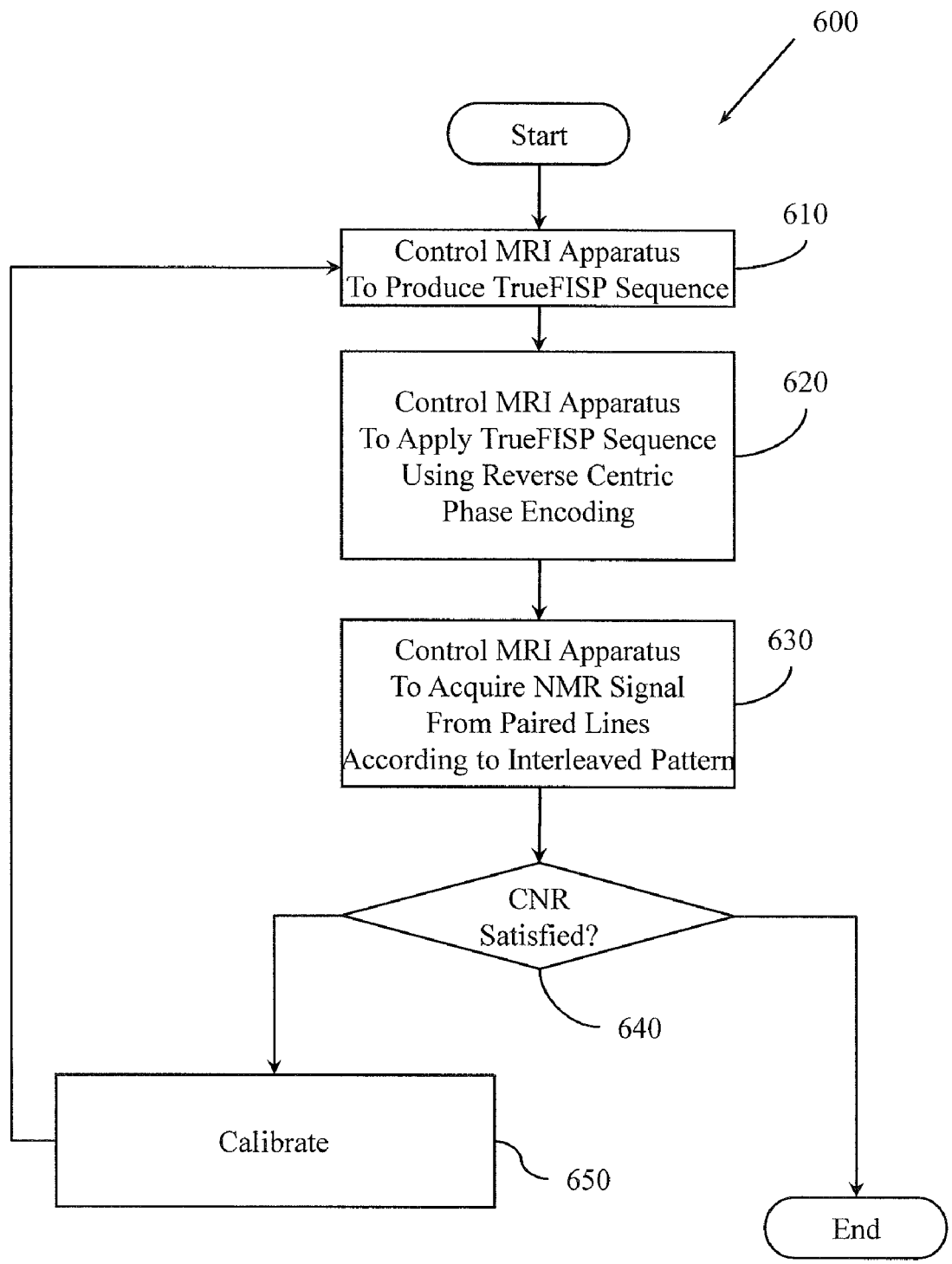
FIG. 8 illustrates a method associated with acquiring intersecting TrueFISP acquisitions using grouped reverse centric phase encoding.

FIG. 8 illustrates another embodiment of method 600. This embodiment includes, at 650, calibrating the MRI apparatus. In one example, the received NMR signal may be analyzed and a determination made at 640. If the determination at 640 is that the contrast to noise ratio is within a desired range, then method 600 can conclude. If the determination at 640 is that the contrast to noise ratio is not within a desired range, then calibration may occur at 650. The calibrating at 650 may include selectively manipulating a pattern associated with the reverse centric phase encoding, which lines in k-space are related (e.g., paired), an interleave pattern associated with acquiring the at least two slices, and so on.

Figure 9:
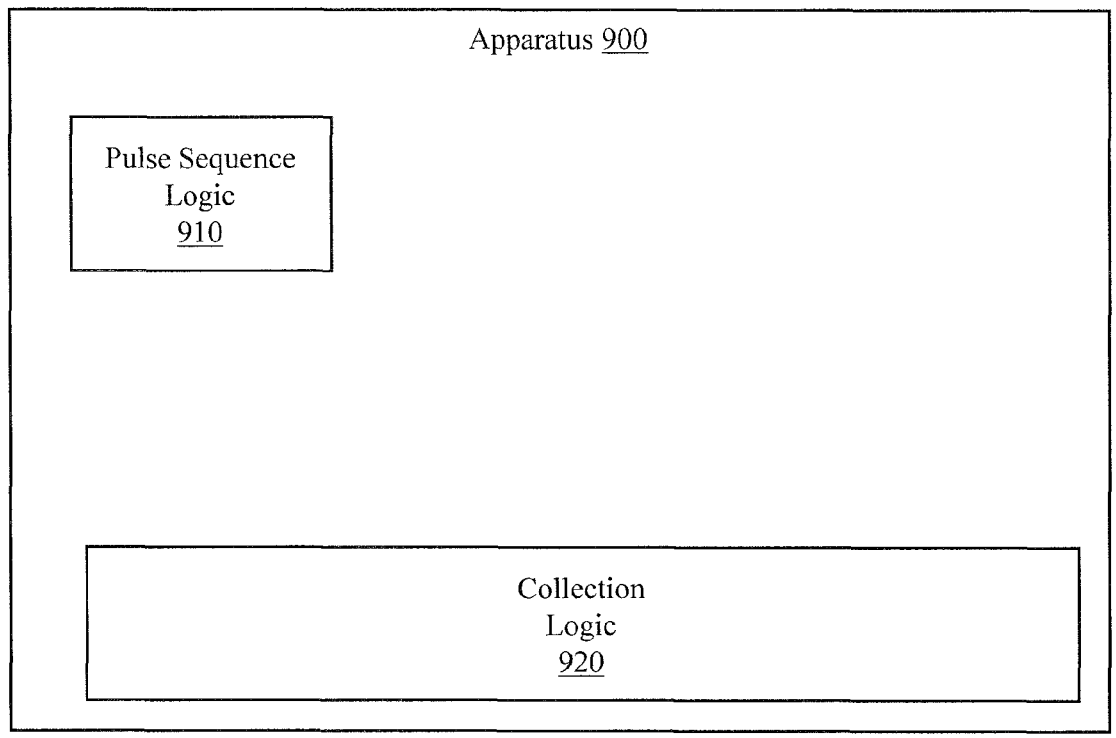
FIG. 9 illustrates an apparatus associated with acquiring intersecting TrueFISP acquisitions using grouped reverse centric phase encoding.

FIG. 9 illustrates an apparatus 900. Apparatus 900 includes a pulse sequence logic 910. Pulse sequence logic 910 is configured to control an MRI apparatus to apply radio frequency (RF) energy to an object to be imaged according to a TrueFISP pulse sequence. The gradients are to be applied according to a grouped reverse centric phase encoding pattern. The RF energy or gradients are to be applied so that NMR signal associated with intersections between two or more planes in the object to be imaged satisfies a desired contrast to noise ratio.

Apparatus 900 also includes a collection logic 920. Collection logic 920 is configured to control the MRI apparatus to collect NMR signal in response to the TrueFISP pulse sequence being applied to the object to be imaged. Collection logic 920 is configured to control the MRI apparatus to collect NMR signal according to a grouped (e.g., paired) related (e.g., adjacent) line pattern. The NMR signal is to be acquired from at least two intersecting slices. In one example, the at least two intersecting slices are orthogonal. While apparatus 900 is illustrated standing alone, in one embodiment it may be incorporated into an MRI apparatus.

Figure 10:
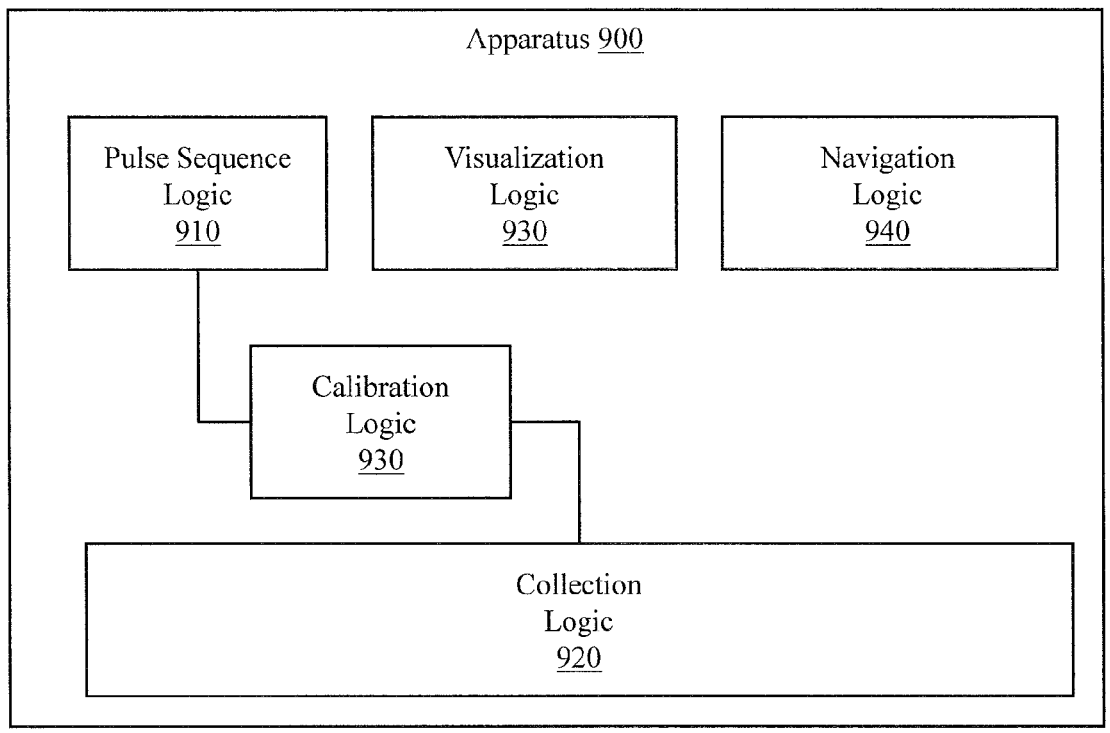
FIG. 10 illustrates an apparatus associated with acquiring intersecting TrueFISP acquisitions using grouped reverse centric phase encoding.

FIG. 10 illustrates another embodiment of apparatus 900. In one example the MRI apparatus with which apparatus 900 interacts is an interventional MRI apparatus. For interventional MRI, and for other applications, visualization and guidance may be desired. Therefore this embodiment of apparatus 900 also includes a visualization logic 930. Visualization logic 930 is configured to provide a multi-plane image based, at least in part, on the NMR signal. One skilled in the art will appreciate that images may be reconstructed and viewed in different manners.

This embodiment of apparatus 900 also includes a navigation logic 940. In one example, navigation logic 940 is configured to control navigation of a device in the object to be imaged based, at least in part, on the NMR signal. In another example, navigation logic 940 is configured to control navigation of a device in the object to be imaged based, at least in part, on a multi-plane image provided by visualization logic 930. One skilled in the art will appreciate that navigation logic 940 may perform tasks including, for example, pattern matching, route following, proximity processing, and so on.

This embodiment of apparatus 900 also includes a calibration logic 950. Calibration logic 950 is configured to selectively manipulate acquisition parameters associated with the TrueFISP sequence. Thus, calibration logic 950 may control one or more of, a pattern associated with the reverse centric phase encoding, which lines in k-space are grouped (e.g., paired), an interleaving pattern associated with acquiring the at least two slices and so on. The calibration may be performed as a function of analyzing a contrast to noise ratio (CNR) associated with NMR signal acquired from intersections between the at least two slices. For example, if NMR signal acquired with a first set of acquisition patterns (e.g., reverse centric phase encoding scheme, pairs of lines, interleave pattern) does not meet a desired CNR threshold, then calibration logic 950 may adjust one or more of the acquisition patterns and control apparatus 900 to cycle through its operations another time. In one example, calibration logic 950 may control apparatus 900 to continue trying different acquisition parameters until the CNR threshold meets a desired threshold or until a defined number of attempts have been made.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A non-transitory computer-readable medium storing computer-executable instructions that when performed by a computer cause the computer to perform a method, the method comprising:
    controlling a magnetic resonance imaging (MRI) apparatus to produce a TrueFISP (True Fast Imaging with Steady State Precession) sequence;
    controlling the MRI apparatus to apply the TrueFISP sequence to an object to be imaged using grouped reverse centric phase encoding; and
    controlling the MRI apparatus to acquire NMR signal from at least two slices that intersect inside the field of view (FOV) of the object to be imaged in response to the TrueFISP sequence being applied to the object to be imaged,
    where the NMR signal from the at least two slices that intersect inside the FOV is acquired from a set of related lines in k-space, where the related lines in k-space are grouped according to an interleaved pattern.

2. The non-transitory computer-readable medium of claim 1, the method comprising providing a real-time multi-plane visualization of a portion of the FOV.

3. The non-transitory computer-readable medium of claim 1, where the set of related lines in k-space are paired adjacent lines.

4. The non-transitory computer-readable medium of claim 2, the method comprising controlling navigation of a device in the object to be imaged based, at least in part, on the real-time multi-plane visualization.

5. The non-transitory computer-readable medium of claim 4, the method comprising controlling navigation of the device in two or more planes.

6. The non-transitory computer-readable medium of claim 3, the method comprising configuring a pattern associated with the grouped reverse centric phase encoding, which adjacent lines in k-space are paired, or the interleave pattern associated with acquiring the at least two slices, to mitigate intersection saturation bands and to mitigate eddy current artifacts to the point where NMR signal associated with intersections between the at least two slices that intersect satisfies a desired contrast to noise ratio.

7. The non-transitory computer-readable medium of claim 1, the method comprising:
    as a function of analyzing a contrast to noise ratio (CNR) associated with NMR signal acquired from intersections between the at least two slices, selectively manipulating the interleaved pattern associated with the grouped reverse centric phase encoding, or which lines in k-space are related.

8. The non-transitory computer-readable medium of claim 1, where the at least two slices are intersecting and orthogonal.

9. The non-transitory computer-readable medium of claim 1, where controlling the MRI apparatus comprises controlling an interventional MRI apparatus.

10. An apparatus for controlling an MRI apparatus, comprising:
    a pulse sequence logic configured to control an MRI apparatus to apply radio frequency (RF) energy and magnetic gradients to an object to be imaged according to a TrueFISP pulse sequence, the RF energy to be applied to at least two intersecting slices according to a grouped reverse centric phase encoding pattern; and
    a collection logic configured to control the MRI apparatus to collect NMR signal from the at least two intersecting slices according to a related k-space set of lines which are grouped in a pattern in response to the TrueFISP pulse sequence.

11. The apparatus of claim 10, the MRI apparatus being an interventional MRI apparatus.

12. The apparatus of claim 10, comprising a visualization logic configured to provide a multi-plane image based, at least in part, on the NMR signal.

13. The apparatus of claim 10, comprising a navigation logic configured to control navigation of a device in the object to be imaged based, at least in part, on the NMR signal.

14. The apparatus of claim 12, comprising a navigation logic configured to control navigation of a device in the object to be imaged based, at least in part, on the multi-plane image.

15. The apparatus of claim 10, comprising a calibration logic configured to selectively manipulate a pattern associated with the grouped reverse centric phase encoding, which lines in k-space are related, or an interleaving pattern associated with acquiring the at least two slices as a function of analyzing a contrast to noise ratio associated with NMR signal acquired from intersections between the at least two slices.

16. The apparatus of claim 10, the at least two intersecting slices being orthogonal.

17. The apparatus of claim 10, the related set of lines being paired adjacent lines in k-space.

18. The apparatus of claim 10, the apparatus being incorporated in the MRI apparatus.

19. The apparatus of claim 10, where the NMR signal associated with intersections between two or more planes in the object to be imaged satisfies a desired contrast to noise ratio.

20. A system for controlling an MRI apparatus, comprising:
    means for producing a TrueFISP (True Fast Imaging with Steady State Precession) MRI sequence;

means for applying the TrueFISP sequence to at least two intersecting slices in an object to be imaged using grouped reverse centric phase encoding; and means for controlling the MRI apparatus to acquire NMR signal in response to the TrueFISP sequence from the at least two intersecting slices where the NMR signal is acquired from the at least two intersecting slices from related lines in k-space which are grouped according to an interleaved pattern.

* * * * *